(12) United States Patent
Hau

(10) Patent No.: US 8,598,951 B1
(45) Date of Patent: Dec. 3, 2013

(54) LINEAR MULTI-MODE POWER AMPLIFIER FOR DYNAMIC SUPPLY OPERATION

(75) Inventor: Gary Hau, Merrimack, NH (US)

(73) Assignee: Anadigics, Inc., Warren, NJ (US)

(*) Notice: Subject to any disclaimer, the term of this patent is extended or adjusted under 35 U.S.C. 154(b) by 16 days.

(21) Appl. No.: 13/437,429

(22) Filed: Apr. 2, 2012

(51) Int. Cl.
*H03F 3/68* (2006.01)

(52) U.S. Cl.
USPC ................ 330/124 R; 330/51; 330/302

(58) Field of Classification Search
USPC ...... 330/51, 53, 54, 84, 124 R, 286, 295, 302
See application file for complete search history.

(56) References Cited

U.S. PATENT DOCUMENTS

| | | | |
|---|---|---|---|
| 7,157,966 B2 | 1/2007 | Baree et al. | |
| 7,304,537 B2 | 12/2007 | Kwon et al. | |
| 7,330,071 B1 | 2/2008 | Dening et al. | |
| 7,345,537 B2 | 3/2008 | Apel et al. | |
| 7,417,508 B1 * | 8/2008 | Quaglietta | 330/302 |
| 7,427,897 B2 | 9/2008 | Hau et al. | |
| 7,518,446 B2 | 4/2009 | Hau | |
| 7,944,291 B2 * | 5/2011 | Jung et al. | 330/124 R |
| 8,279,010 B2 * | 10/2012 | Seki et al. | 330/295 |
| 8,324,964 B2 * | 12/2012 | Retz et al. | 330/51 |

* cited by examiner

*Primary Examiner* — Khanh V Nguyen
(74) *Attorney, Agent, or Firm* — William L. Botjer

(57) ABSTRACT

A multi-mode RF power amplifier circuit that operates under dynamic power supply conditions. The power amplifier circuit operates under a high power mode and a low power mode. The multi-mode RF power amplifier includes a low power path and a high power path. Under the high power mode of operation, the high power path becomes active and the low power path becomes inactive. Each of the low power path and the high power path includes impedance matching networks and power amplifiers. Under either mode of operation, an inactive path will present at least five times higher input impedance than that of an active path. An impedance matching network connected between output terminals of the high power path and the low power path provides isolation between the output terminals of the high power path and the low power path.

22 Claims, 12 Drawing Sheets

LINEAR MULTI-MODE POWER AMPLIFIER FOR DYNAMIC SUPPLY OPERATION

TECHNICAL FIELD

The present invention relates, in general, to power amplifiers. More specifically, the present invention relates to Radio Frequency (RF) power amplifiers used in the field of cellular communication.

BACKGROUND

A key component in any wireless communication system is an RF power amplifier circuit that is enabled by a wide variety of semiconductor technologies. These RF power amplifier circuits generally operate in a variety of modes and hence the term 'Multi-mode RF power amplifiers'. The multi-mode RF power amplifier circuits used in 3G/4G mobile handsets utilize switch path architecture. According to the architecture, switches placed in various paths, turn on or off to respectively activate or deactivate a particular path. A conventional multi-mode RF power amplifier circuit is designed to operate under two power modes, a high power mode and a low power mode. The conventional multi-mode RF power amplifier circuit includes a high power path and a low power path that are placed parallel to each other. In the high power mode, the high power path is active and the low power path is inactive. Whereas, in the low power mode, the low power path is active and the high power path is inactive. The RF power amplifier circuits are designed in such a way that only one of the two paths is active at any given time. This is achieved with the help of switches placed in these paths. Switches, such as FET switches, placed in the high and low power paths control the switching between the two parallel paths. The voltage difference between a gate and a drain of the FET switch determines the switching on and off of the FET switch. The FET switch will be switched on when the gate and drain terminals are biased with a same voltage and switched off when the gate and drain terminals have a potential difference that is less than a pinch-off voltage of the FET switch. The logic levels available for biasing the FET switch are 0V and the battery/power amplifier collector bias voltage.

In the prior art, under the high power mode of operation, when a supply voltage $V_{cc}$ is reduced to a certain level such that the voltage difference between the gate and drain terminals of the FET switch placed in the inactive low power path becomes higher than the pinch-off voltage of the FET switch, the FET switch placed in the inactive low power path is switched on. Consequently, a portion of output power from a power amplifier placed in the high power path is diverted into a matching network in the low power path rather than being transferred to an RF output terminal. Therefore, the power amplifier placed in the high power path has to deliver higher output power to compensate for the loss of output power to the low power path when the supply voltage $V_{cc}$ is reduced. This results in a considerable amount of performance degradation in terms of gain, current consumption and linearity.

In view of the foregoing, there arises a need for an efficient multi-mode RF power amplifier circuit that provides improved isolation between the active and the inactive power paths.

SUMMARY OF THE INVENTION

An object of the invention is to realize a multi-mode RF power amplifier circuit that provides improved isolation between active and inactive power paths.

Another object of the invention is to eliminate the need of switches at an output terminal of the active and the inactive paths of a multi-mode RF power amplifier circuit.

Yet another object of the invention is to provide a multi-mode RF power amplifier circuit that can operate under dynamic bias voltage.

Still another object of the invention is to provide a multi-mode RF power amplifier circuit having improved gain, power added efficiency and linearity.

In accordance with the objects of the invention, various embodiments of the invention provide a power amplifier circuit for amplifying a radio frequency (RF) signal. The power amplifier circuit operates in at least one of a first power amplification mode and a second power amplification mode. The power amplifier circuit comprises a first power amplification path, one or more second power amplification paths and a first impedance matching network. The first power amplification path has an input terminal and an output terminal. The first power amplification path is active when the power amplifier circuit operates in the first power amplification mode. The one or more second power amplification paths have an input terminal and an output terminal. One of the one or more second power amplification paths is active and the remaining of the one or more second power amplification paths are inactive when the power amplifier circuit operates in the second power amplification mode. Also, the input terminal of each of the one or more second power amplification paths is coupled to the input terminal of the first power amplification path. The first impedance matching network is respectively connected between the output terminal of each of the one or more second power amplification paths and the output terminal of the first power amplification path. An output impedance of the first impedance matching network respectively connected between the output terminal of the each inactive second power amplification path and the output terminal of the first power amplification path satisfies a first pre-determined condition when the power amplifier circuit operates in the first power amplification mode. The output impedance of the first impedance matching network satisfies a second pre-determined condition when the power amplifier circuit operates in the second power amplification mode. An input impedance of the first impedance matching network connected between the output terminal of the active second power amplification path and the output terminal of the first power amplification path satisfies a third pre-determined condition when the power amplifier circuit operates in the second power amplification mode.

BRIEF DESCRIPTION OF THE DRAWINGS

Various embodiments of the invention will, hereinafter, be described in conjunction with the appended drawings provided to illustrate and not to limit the invention, wherein like designations denote like elements, and in which.

DETAILED DESCRIPTION OF THE PREFERRED EMBODIMENTS

The detailed description of the appended drawings is intended as a description of the currently preferred embodiments of the invention, and is not intended to represent the only form in which the invention may be practiced. It is to be understood that the same or equivalent functions may be accomplished by different embodiments that are intended to be encompassed within the spirit and scope of the invention.

The invention provides an improved multi-mode RF power amplifier circuit that operates under a dynamic power supply. According to the invention, the multi-mode RF power amplifier circuit operates in a high power mode and a low power mode. The multi-mode RF power amplifier includes a low power path and a high power path. Under the high power mode of operation, the high power path becomes active and the low power path becomes inactive. Each of the low power path and the high power path includes impedance matching networks and power amplifiers. Under either mode of operation, an inactive path will present at least 10 times higher input impedance than that of an active path. An impedance matching network connected between the output terminals of the high power path and the low power path provides isolation between the output terminals of the high power path and the low power path.

Figure 1A:
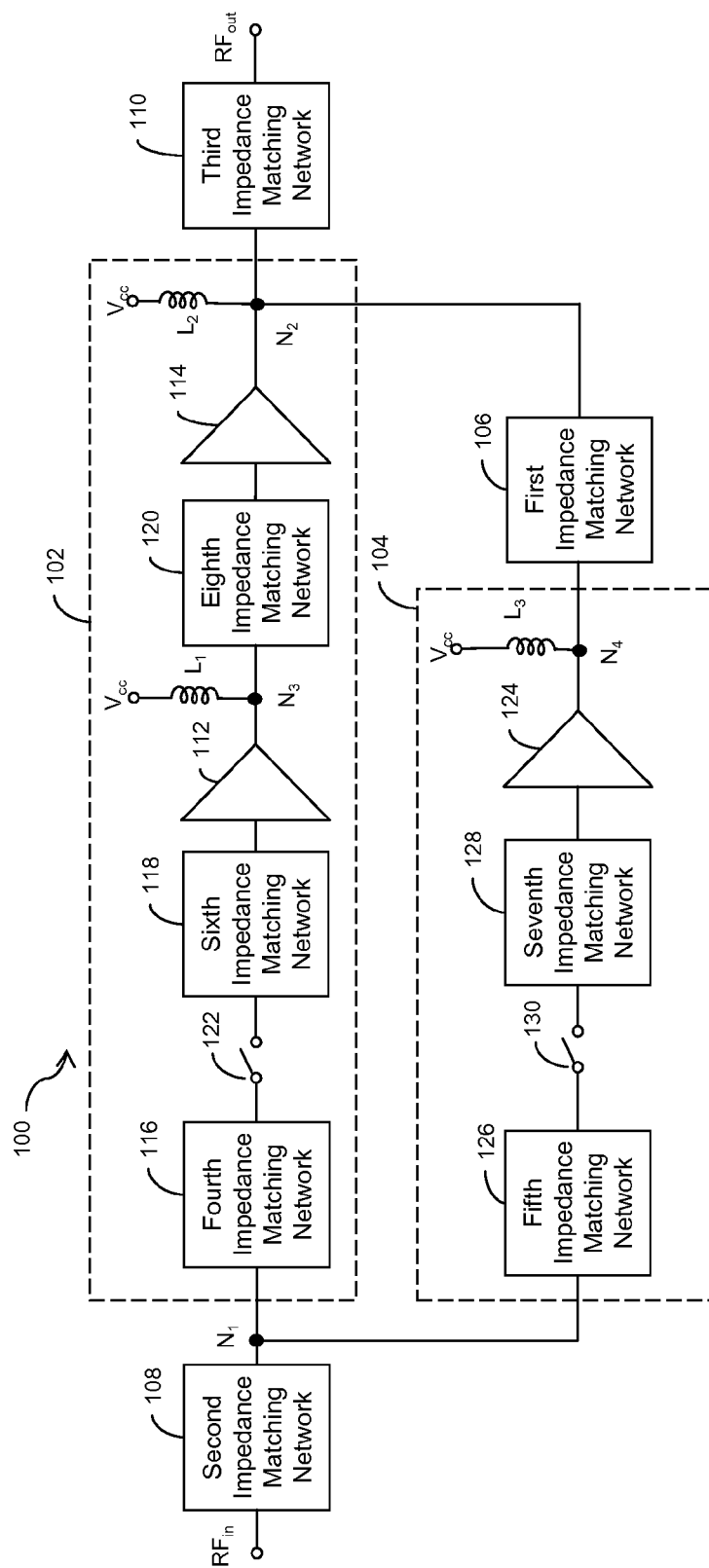
FIG. 1a is an exemplary block diagram of a multi-mode RF power amplifier circuit, in accordance with an embodiment of the invention.

FIG. 1a is an exemplary block diagram of a multi-mode RF power amplifier circuit 100 in accordance with an embodiment of the invention. The power amplifier circuit 100 operates under a first power amplification mode, hereinafter referred to as a "high power mode" and a second power amplification mode, hereinafter referred to as a "low power mode". FIG. 1 is shown to include, a first power amplification path 102, hereinafter referred to as a "high power path 102", a second power amplification path 104, hereinafter referred to as a "low power path 104", a first impedance matching network 106, a second impedance matching network 108, and a third impedance matching network 110. High power path 102 includes a first power amplifier 112, a second power amplifier 114, a fourth impedance matching network 116, a sixth impedance matching network 118, an eighth impedance matching network 120, a first input switch 122, an inductor $L_1$, and an inductor $L_2$. Low power path 104 includes a third power amplifier 124, a fifth impedance matching network 126, a seventh impedance matching network 128, a second input switch 130, and an inductor $L_3$.

A radio frequency (RF) signal $RF_{in}$ to be amplified is applied to an input terminal of second impedance matching network 108. An output terminal of second impedance matching network 108 is connected to a node $N_1$. An input terminal of high power path 102 and an input terminal of low power path 104 are coupled to the node $N_1$. An output terminal of high power path 102 is connected to a node $N_2$. An input terminal of fourth impedance matching network 116 is connected to the node $N_1$. An output terminal of fourth impedance matching network 116 is connected to a first terminal of first input switch 122. A second terminal of first input switch 122 is connected to an input terminal of sixth impedance matching network 118. An output terminal of sixth impedance matching network 118 is connected to an input terminal of first power amplifier 112. An output terminal of first power amplifier 112 is connected to a node $N_3$. An input terminal of eighth impedance matching network 120 and a first terminal of the inductor $L_1$ are connected to the node $N_3$. A second terminal of the inductor $L_1$ is connected to a voltage supply $V_{cc}$. An output terminal of eighth impedance matching network 120 is connected to an input terminal of second power amplifier 114. An output terminal of second power amplifier 114 is connected to the node $N_2$. A first terminal of the inductor $L_2$ is connected to the node $N_2$. A second terminal of the inductor $L_2$ is connected to the voltage supply $V_{cc}$. An input terminal of third impedance matching network 110 is connected to the node $N_2$. An output terminal of second power amplifier 114 provides an amplified RF output signal $RF_{out}$.

An input terminal of fifth impedance matching network 126 is connected to the node $N_1$. An output terminal of fifth impedance matching network 126 is connected to a first terminal of second input switch 130. A second terminal of second input switch 130 is connected to an input terminal of seventh impedance matching network 128. An output terminal of seventh impedance matching network 128 is connected to an input terminal of third power amplifier 124. An output terminal of third power amplifier 124 is connected to a node $N_4$. A first terminal of inductor $L_3$ is connected to the node $N_4$. A second terminal of inductor $L_3$ is connected to the voltage supply $V_{cc}$. An input terminal of first impedance matching network 106 is connected to the node $N_4$. An output terminal of first impedance matching network 106 is connected to the node $N_2$.

According to an embodiment of the present invention as illustrated in FIG. 1, high power path 102 and low power path 104 are placed in parallel to each other and each path is designed to operate under a certain output power range. At any given point of time, the RF signal $RF_{in}$ will be transmitted and amplified through one of the paths.

In an embodiment of the invention, the input terminal of second impedance matching network 108 receives the RF signal $RF_{in}$. Under the high power mode operation, first power amplifier 112 and second power amplifier 114 amplifies the RF signal $RF_{in}$ and provides the amplified signal to the output terminal of high power path 102. The amplified signal is applied to the input terminal of third impedance matching network 110. Under the low power mode operation, power amplifier 124 amplifies the RF signal $RF_{in}$ and provides the amplified signal to the output terminal of low power path 104.

The amplified signal is applied to the input terminal of third impedance matching network 110 through first impedance matching network 106. The output terminal of third impedance matching network 110 provides the $RF_{out}$ signal. First impedance matching network 106, second impedance matching network 108, third impedance matching network 110, fourth impedance matching network 116, fifth impedance matching network 126, sixth impedance matching network 118, seventh impedance matching network 128, and eighth impedance matching network 120 matches an impedance provided at their respective input terminals to an impedance provided at their respective output terminals.

Figure 1B:
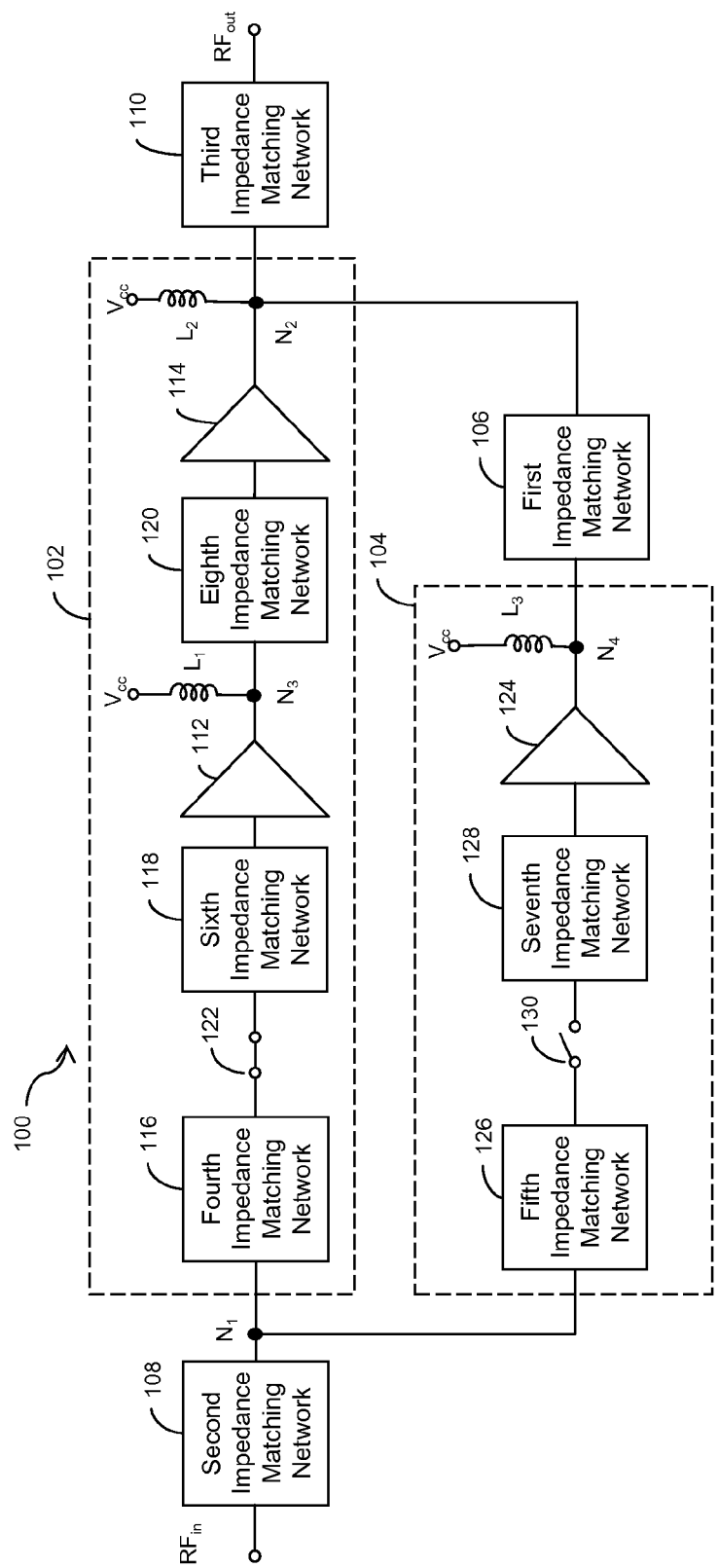
FIG. 1b is an exemplary block diagram of a multi-mode RF power amplifier circuit operating under high power mode, in accordance with an embodiment of the invention.

FIG. 1b is an exemplary block diagram of the multi-mode RF power amplifier circuit 100 working under the high power mode in accordance with an embodiment of the invention. Power amplifier circuit 100 (refer to FIG. 1b) includes the elements illustrated to be a part of power amplifier circuit 100 (refer to FIG. 1a) and using the same reference numbers. Further, power amplifier circuit 100 (refer to FIG. 1b) has a component connection configuration identical to power amplifier circuit 100 (refer to FIG. 1a) except for first input switch 122 which has been switched on. The functional operation of components are identical in power amplifier circuit 100 (refer to FIG. 1b) and power amplifier circuit 100 (refer to FIG. 1a) is identical, except for first input switched 122 which has been switched on. Under the high power mode operation, first input switch 122 is switched on so that high power path 102 becomes the active path and second input switch 130 will be switched off so that low power path 104 becomes an inactive path. Therefore, one or more power amplifiers 112 and 114 present in high power path 102 amplify the RF signal $RF_{in}$.

In an embodiment of the invention, under the high power mode operation of power amplifier circuit 100, isolation between the input terminals of high power path 102 and low power path 104 is achieved when an input impedance of fifth impedance matching network 126 of inactive low power path 104 satisfies a fifth pre-determined condition. According to the fifth pre-determined condition, the input impedance of fifth impedance matching network 126 of inactive low power path 104 is at least five times greater than an input impedance of fourth impedance matching network 116 of active high power path 102. In accordance with another embodiment of the present disclosure, the input impedance of fifth impedance matching network 126 of inactive low power path 104 is ten times greater than an input impedance of fourth impedance matching network 116 of active high power path 102. Therefore, the RF signal $RF_{in}$ applied to the input terminal of high power path 102 sees the high impedance presented by inactive low power path 104 and is coupled to fourth impedance matching network 116.

Under the high power mode operation of power amplifier circuit 100, isolation between the output terminals of high power path 102 and low power path 104 is achieved when an output impedance of first impedance matching network 106 connected between active high power path 102 and inactive low power path 104 satisfies a first pre-determined condition. According to the first pre-determined condition, the output impedance of first impedance matching network 106 connected between active high power path 102 and inactive low power path 104 is at least five times greater than an input impedance of third impedance matching network 110. In accordance with another embodiment of the present disclosure, the output impedance of first impedance matching network 106 connected between active high power path 102 and inactive low power path 104 is at least ten times greater than an input impedance of third impedance matching network 110.

Figure 1C:
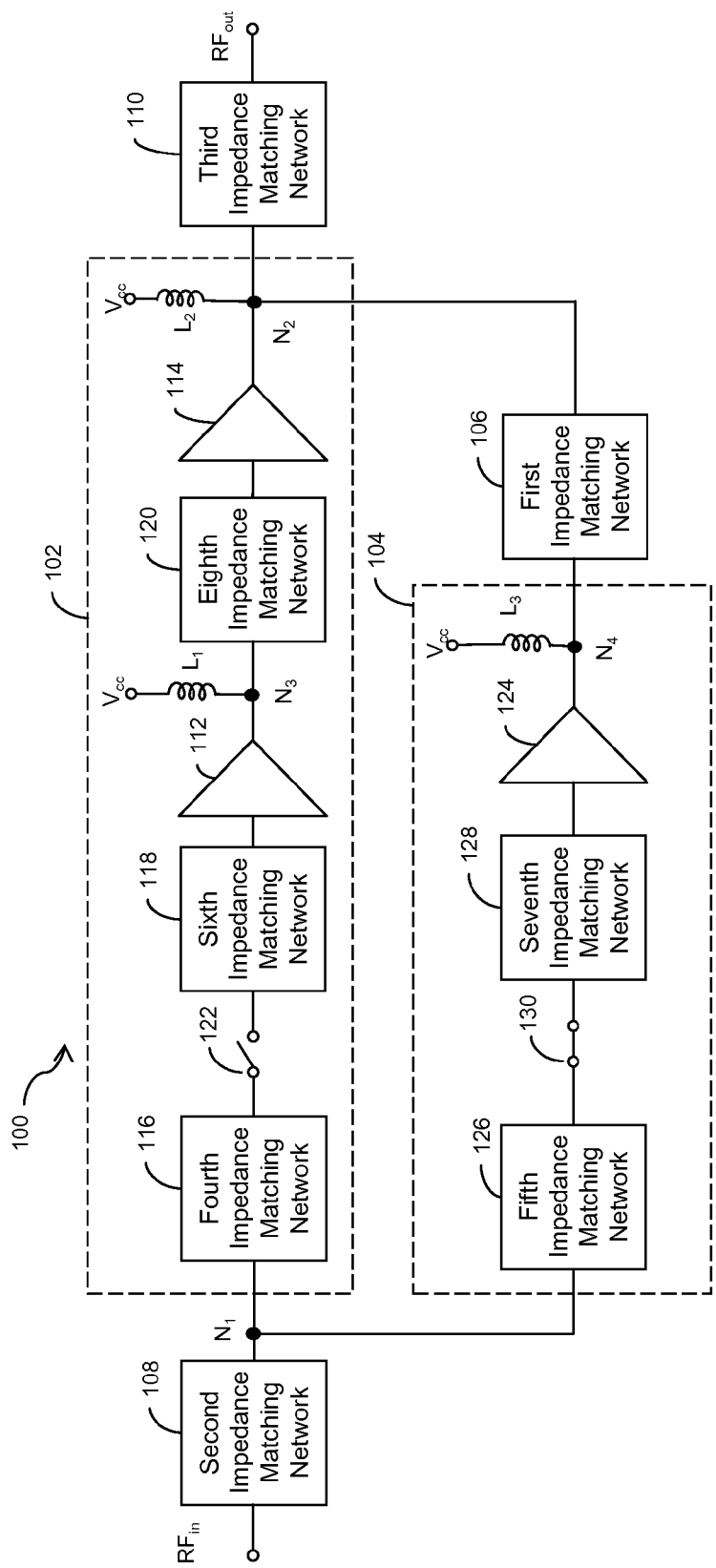
FIG. 1c is an exemplary block diagram of a multi-mode RF power amplifier circuit operating under low power mode, in accordance with an embodiment of the invention.

FIG. 1c is an exemplary block diagram of the multi-mode RF power amplifier circuit 100 working under the low power mode, in accordance with an embodiment of the invention. Power amplifier circuit 100 (refer to FIG. 1c) includes the elements illustrated to be a part of power amplifier circuit 100 (refer to FIG. 1a) and using the same reference numbers. Further, power amplifier circuit 100 (refer to FIG. 1c) has a component connection configuration identical to power amplifier circuit 100 (refer to FIG. 1a), except for second input switch 130 which has been switched on. The functional operation of components are identical in power amplifier circuit 100 (refer to FIG. 1c) and power amplifier circuit 100 (refer to FIG. 1a) is identical, except for second input switch 130 which has been switched on. Under the low power mode operation, second input switch 130 is switched on so that low power path 104 becomes the active path and first input switch 122 is switched off so that high power path 102 becomes an inactive path. Therefore, one or more power amplifiers 124 present in low power path 104 amplifies the RF signal $RF_{in}$.

In an embodiment of the invention, under the low power mode operation of power amplifier circuit 100, isolation between the input terminals of high power path 102 and low power path 104 is achieved when an input impedance of fourth impedance matching network 116 satisfies a fourth pre-determined condition. According to the fourth pre-determined condition, an input impedance of fourth impedance matching network 116 of inactive high power path 102 is at least five times greater than an input impedance of fifth impedance matching network 126 of active low power path 104. In accordance with another embodiment of the present disclosure, the input impedance of fourth impedance matching network 116 of inactive high power path 102 is ten times greater than an input impedance of fifth impedance matching network 126 of active low power path 104. Therefore, the RF signal $RF_{in}$ applied to the input terminal of low power path 104 sees the high impedance presented by inactive high power path 102 and is coupled to fifth impedance matching network 126.

Under the low power mode operation of power amplifier circuit 100, the maximum power level of active low power path 104 is determined by an input impedance of first impedance matching network 106 connected between the output terminal of active low power path 104 and the output terminal of inactive high power path 102. Under the low power mode operation, an input impedance of first impedance matching network 106 satisfies a third pre-determined condition. According to the third pre-determined condition, the input impedance of first impedance matching network 106 is comparatively greater than an input impedance of third impedance matching network 110.

It will be readily apparent to one skilled in the art that impedance matching networks 106, 108, 110, 116, 118, 120, 126 and 128 shown in the FIG. 1 can be realized as either lumped passive components (capacitors, inductors and resistors) or distributed components or a combination of both.

Further, first input switch 122 and second input switch 130 can be realized in various mechanical or solid state technologies such as Microelectromechanical systems (MEMS), a Field Effect Transistor (FET), a Metal Semiconductor Field Effect Transistor (MESFET), a High Electron Mobility Transistor (HEMT), a Bipolar Junction Transistor (BJT), p-n diodes, and PIN diodes. Furthermore, the above mentioned technologies can be fabricated in various material systems such as bulk Si, Silicon On Insulator (SOI), Silicon On Sapphire (SOS), III-IV compound semiconductor such as Gallium Arsenide (GaAs) and Indium Phosphide (InP).

Figure 2A:
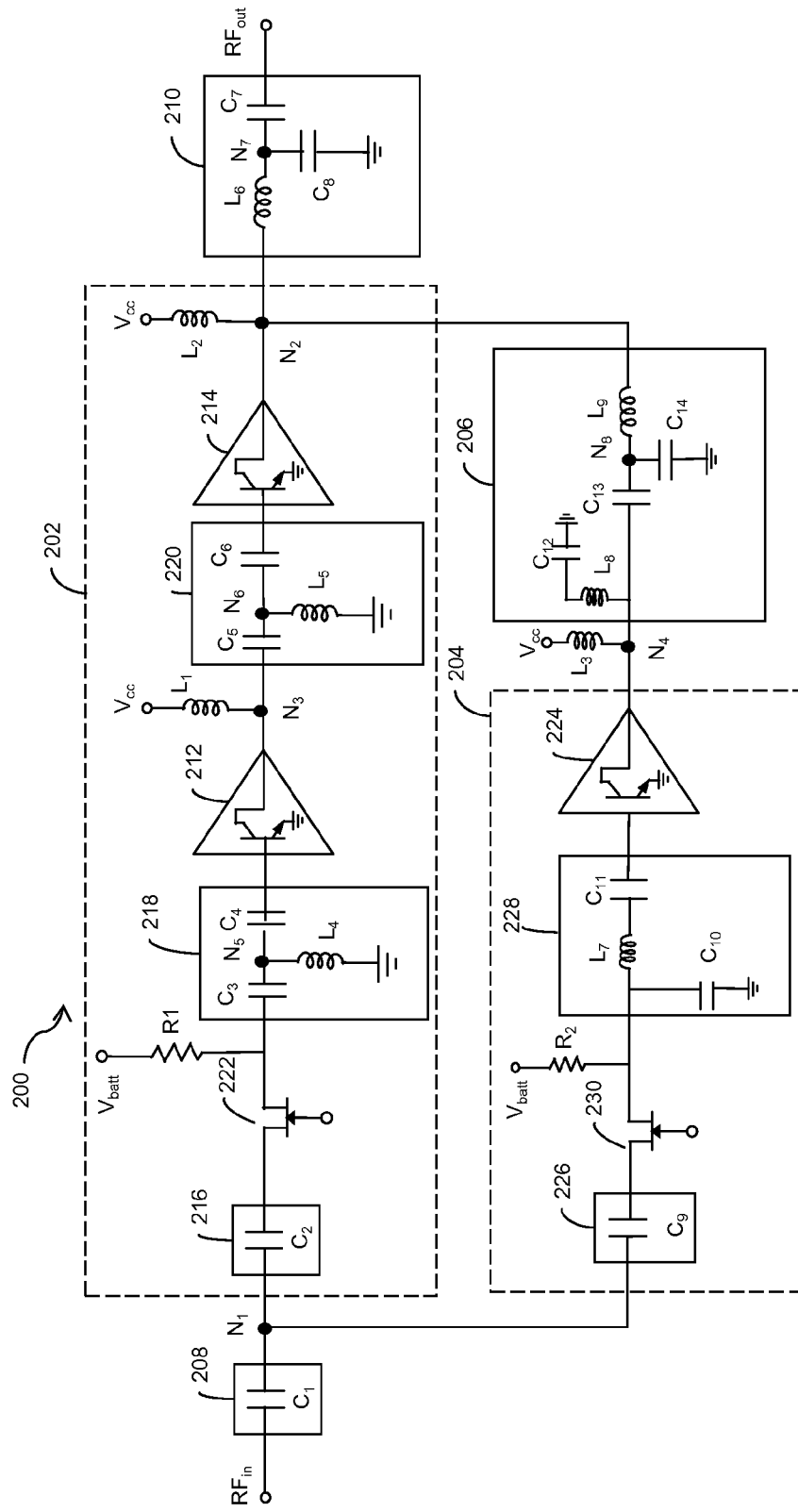
FIG. 2a is an exemplary detailed circuit implementation of a multi-mode RF power amplifier circuit, in accordance with an embodiment of the invention.

FIG. 2a is an exemplary detailed circuit implementation of a multi-mode RF power amplifier circuit 200, in accordance with an embodiment of the invention. Power amplifier circuit 200 (refer to FIG. 2a) has a component connection configuration identical to power amplifier circuit 100 (refer to FIG. 1a). Further, power amplifier circuit 200 (refer to FIG. 2a) includes the elements illustrated to be a part of power amplifier circuit 100 (refer to FIG. 1a). The functional operation of components are identical in power amplifier circuit 200 (refer to FIG. 2a) and power amplifier circuit 100 (refer to FIG. 1a) is also identical.

First power amplifier 212, second power amplifier 214, and third power amplifier 224 respectively corresponds to first power amplifier 112, second power amplifier 114 and third power amplifier 124. In an embodiment, power amplifiers 212, 214, and 224 are shown in FIG. 2a to include a transistor. The transistor can be realized in various mechanical or solid state technologies such as a Bipolar Junction Transistor (BJT), Field Effect Transistor (FET), a Hetero Junction Transistor (HJT), a Pseudomorphic High Electron Mobility Transistor (pHEMT), Complementary-symmetry Metal Oxide Semiconductor (CMOS), Laterally Diffused Metal Oxide Semiconductor (LDMOS), and Bipolar Complementary-symmetry Metal Oxide Semiconductor (BiCMOS). Further, the above mentioned technologies can be fabricated in various material systems such as bulk Si, Silicon On Insulator (SOI), Silicon On Sapphire (SOS), and III-IV compound semiconductor such as Gallium Arsenide (GaAs) and Indium Phosphide (InP).

First impedance matching network 206, second impedance matching network 208, third impedance matching network 210, fourth impedance matching network 216, fifth impedance matching network 226, sixth impedance matching network 218, seventh impedance matching network 228, and eighth impedance matching network 220 corresponds to first impedance matching network 106, second impedance matching network 108, third impedance matching network 110, fourth impedance matching network 116, fifth impedance matching network 126, sixth impedance matching network 118, seventh impedance matching network 128, and eighth impedance matching network 120 respectively.

Second impedance matching network 208 includes a capacitor $C_1$. Fourth impedance matching network 216 includes a capacitor $C_2$. Sixth impedance matching network 218 includes a capacitor $C_3$, a capacitor $C_4$ and an inductor $L_4$. A first terminal of the capacitor $C_3$ is connected to the input terminal of sixth impedance matching network 218. A second terminal of the capacitor $C_3$ is connected to a node $N_5$. A first terminal of the capacitor $C_4$ is connected to the node $N_5$. A second terminal of the capacitor $C_4$ is connected to the output terminal of sixth impedance matching network 218. A first terminal of the inductor $L_4$ is connected to the node $N_5$ and a second terminal of the inductor $L_4$ is connected to a ground.

Eighth impedance matching network 220 includes a capacitor $C_5$, a capacitor $C_6$ and an inductor $L_5$. A first terminal of the capacitor $C_5$ is connected to the input terminal of eighth impedance matching network 220. A second terminal of the capacitor $C_5$ is connected to a node $N_6$. A first terminal of the capacitor $C_6$ is connected to node $N_6$. A second terminal of the capacitor $C_6$ is connected to the output terminal of eighth impedance matching network 220. A first terminal of the inductor $L_5$ is connected to the node $N_6$ and a second terminal of the inductor $L_5$ is connected to the ground.

Third impedance matching network 210 includes an inductor $L_6$, a capacitor $C_7$ and a capacitor $C_8$. The first terminal of the inductor $L_6$ is connected to the input terminal of third impedance matching network 210. A second terminal of the inductor $L_6$ is connected to a node $N_7$. A first terminal of the capacitor $C_7$ is connected to the node $N_7$. A second terminal of the capacitor $C_7$ is connected to the output terminal of third impedance matching network 210. A first terminal of the capacitor $C_8$ is connected to the node $N_7$. A second terminal of the capacitor $C_8$ is connected to the ground.

Fifth impedance matching network 226 includes a capacitor $C_9$. Seventh impedance matching network 228 includes an inductor $L_7$, a capacitor $C_{10}$ and a capacitor $C_{11}$. A first terminal of the inductor $L_7$ is connected to the input terminal of seventh impedance matching network 228. A second terminal of the inductor $L_7$ is connected to a first terminal of the capacitor $C_{11}$. A second terminal of the capacitor $C_{11}$ is connected to the output terminal of seventh impedance matching network 228. A first terminal of the capacitor $C_{10}$ is connected to the input terminal of seventh impedance matching network 228. A second terminal of the capacitor $C_{10}$ is connected to the ground.

In an embodiment, first impedance matching network 206 includes an inductor $L_8$, an inductor $L_9$, a capacitor $C_{12}$, a capacitor $C_{13}$ and a capacitor $C_{14}$. A first terminal of the inductor $L_8$ is connected to the input terminal of first impedance matching network 206. A second terminal of the inductor $L_8$ is connected to a first terminal of the capacitor $C_{12}$. A second terminal of the capacitor $C_{12}$ is connected to the ground. A first terminal of the capacitor $C_{13}$ is connected to the input terminal of first impedance matching network 206. A second terminal of the capacitor $C_{13}$ is connected to a node $N_8$. A first terminal of the capacitor $C_{14}$ is connected to the node $N_8$. A second terminal of the capacitor $C_{14}$ is connected to the ground. A first terminal of the inductor $L_9$ is connected to the node $N_8$ and a second terminal of the inductor $L_9$ is connected to the output terminal of first impedance matching network 206.

First input switch 222 and second input switch 230 respectively correspond to first input switch 122 and second input switch 130 as shown in FIG. 1a. In an embodiment, each first input switch 222 and second input switch 230 is shown as a transistor switch in FIG. 2a.

Figure 2B:
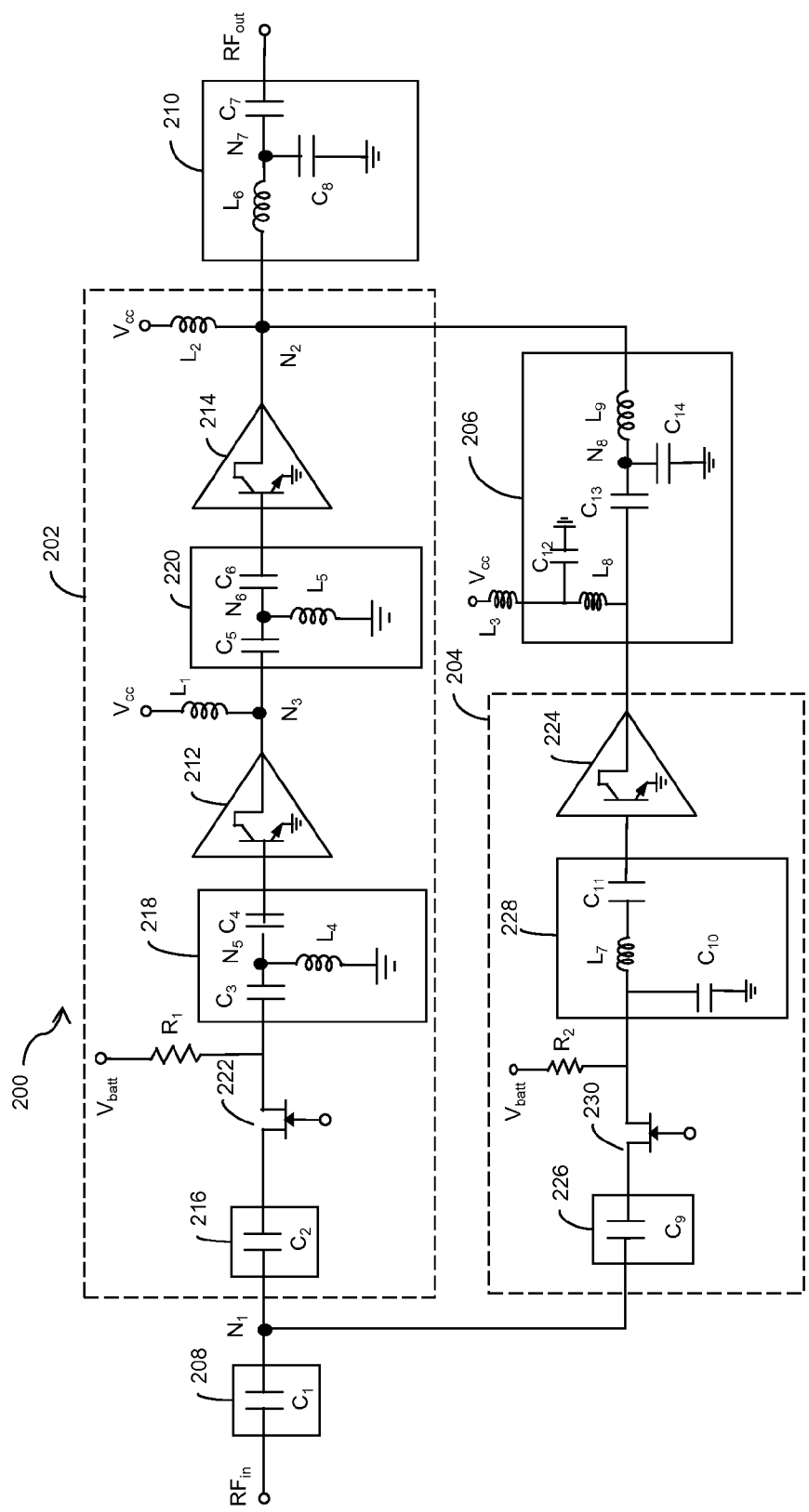
FIG. 2b is an exemplary detailed circuit implementation of a multi-mode RF power amplifier circuit, in accordance with another embodiment of the invention.

FIG. 2b is an exemplary detailed circuit implementation of multi-mode RF power amplifier circuit 200, in accordance with another embodiment of the invention. Power amplifier circuit 200 (refer to FIG. 2b) has a component connection configuration identical to power amplifier circuit 200 (refer to FIG. 2a). Further, power amplifier circuit 200 (refer to FIG. 2b) includes the elements illustrated to be a part of power amplifier circuit 200 (refer to FIG. 2a) and using the same reference numbers. The functional operation of components shown to be identical in power amplifier circuit 200 (refer to FIG. 2b) and power amplifier circuit 200 (refer to FIG. 2a) is identical. Further, power amplifier circuit 200 (refer to FIG. 2b) has a component connection configuration identical to power amplifier circuit 200 (refer to FIG. 2a), except for the connection of the first terminal of the inductor $L_3$ which is shown to be connected to the second terminal of the inductor $L_8$.

In the power amplifier circuit 200 shown in FIG. 2b, a part of the inductor $L_3$ is absorbed into the inductor $L_8$. Hence, the value and size of the inductor $L_3$ in FIG. 2b would be smaller than that of the inductor $L_3$ shown in the FIG. 2a.

The input impedances of the impedance matching circuits (such as first impedance matching network 106, second impedance matching network 108, third impedance matching network 110, fourth impedance matching network 116, fifth impedance matching network 126, sixth impedance matching network 118, seventh impedance matching network 128, and eighth impedance matching network 120) depend on values of the inductors (such as $L_4, L_5, L_6, L_7,$ and $L_8$) and capacitors (such as $C_1, C_2, C_3, C_4, C_5, C_6, C_7, C_8, C_9, C_{10}, C_{11}, C_{12}, C_{13},$ and $C_{14}$) that form the impedance matching circuits. Accordingly, the pre-determined conditions (such as the first pre-determined condition, the second pre-determined condition, the third pre-determined condition, the fourth pre-determined condition, the fifth pre-determined condition, the sixth pre-determined condition, the seventh pre-determined condition, and the eight pre-determined condition) also depend on the values of the inductors and the capacitors that form the impedance matching circuits.

Figure 3:
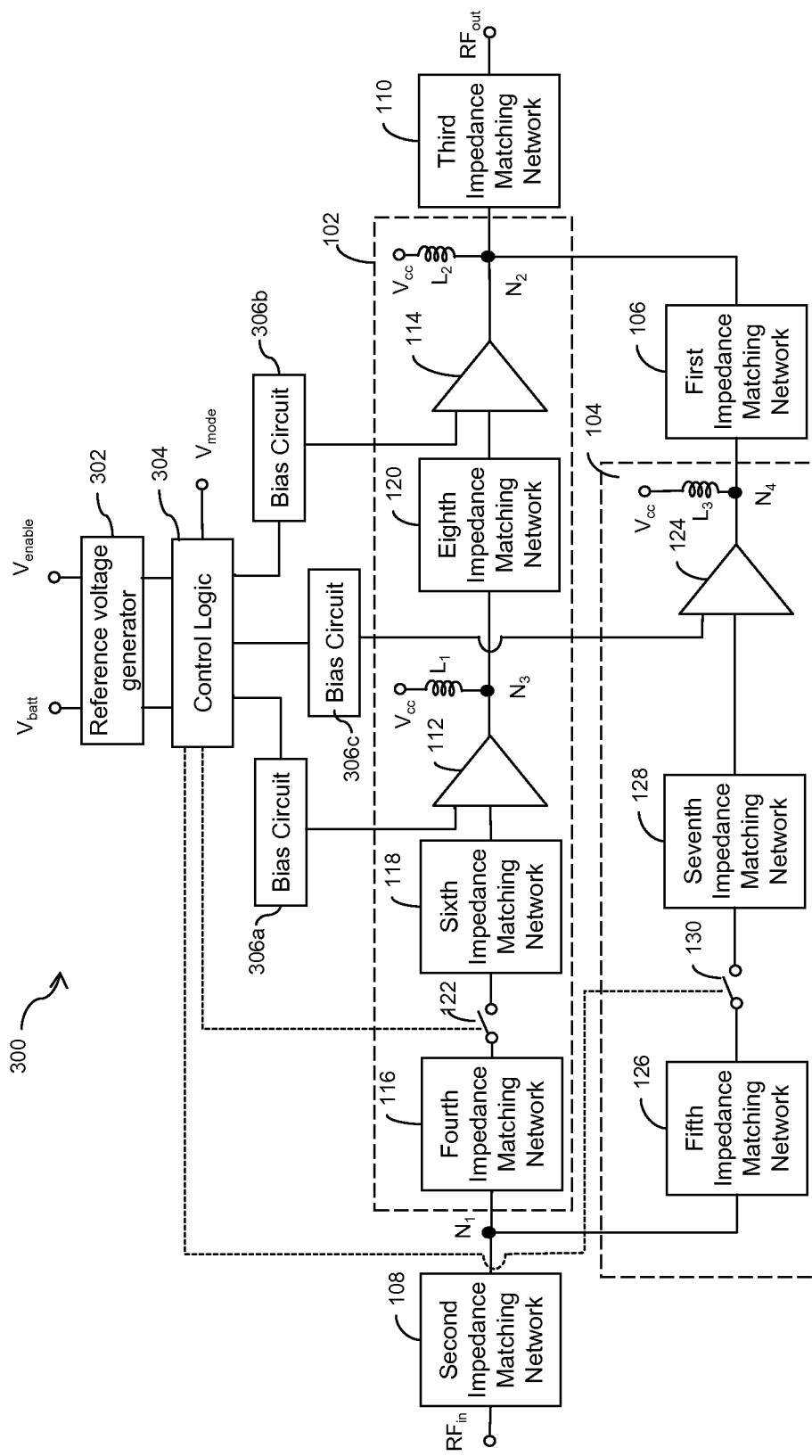
FIG. 3 is an exemplary detailed implementation of a multi-mode RF power amplifier circuit, in accordance with another embodiment of the invention.

FIG. 3 is an exemplary detailed implementation of a multi-mode RF power amplifier circuit 300, in accordance with another embodiment of the invention. Power amplifier circuit 300 includes the elements illustrated to be a part of power amplifier circuit 100 (refer to FIG. 1a) except for the inclusion of a reference voltage generator 302, a control logic 304, and bias circuits 306a, 306b, and 306c. The component connection configuration and the functional operation of components shown to be identical in power amplifier circuit 100 (refer to FIG. 1a) and power amplifier circuit 300 is identical.

A first terminal of each bias circuit 306a, 306b, and 306c is connected to control logic 304. Control logic 304 is, in turn, connected to reference voltage generator 302. A second terminal of each bias circuits 306a, 306b and, 306c is respectively connected to a bias terminal of first power amplifier 112, second power amplifier 114 and third power amplifier 124.

A battery voltage $V_{batt}$ and an enabling voltage $V_{enable}$ is applied to reference voltage generator 302. Reference voltage generator 302 generates a reference voltage based on the $V_{batt}$ and $V_{enable}$. The reference voltage is applied to control logic 304. Control logic further receives a voltage $V_{mode}$ which enables power amplifier circuit 300 to operate in one of the two power modes of operation. Output terminals of control logic 304 are coupled to each of bias circuits 306a, 306b and 306c, first input switch 122, and second input switch 130. Bias circuits 306a, 306b and 306c are respectively connected to power amplifiers 112, 114 and 124.

Bias circuits 306a, 306b and 306c provide biasing voltage to power amplifiers 112, 114, and 124 respectively. Control logic 304 controls switching on and off of input switches 122 and 130, and power amplifiers 112, 114, and 124. Control logic 304 enables power amplifier circuit 300 to operate in one of the high power mode and the low power mode by activating the corresponding power amplification path and deactivating the other power amplification path. Control logic 304 enables an active power amplification path by switching on the corresponding input switch and turning on the power amplifiers connected in the power amplification path by biasing the corresponding bias circuits. Control logic 304 disables an inactive power amplification path by switching off the corresponding input switch and turning off the power amplifiers connected in the power amplification path by unbiasing the corresponding bias circuits. For example, under high power mode operation, control logic 304 enables high power path 102 to be active by switching on first input switch 122 and turning on power amplifiers 112 and 114. Further, under high power mode operation, control logic 304 disables low power path 104 to be inactive by switching off second input switch 130 and turning off power amplifier 124.

Figure 4A:
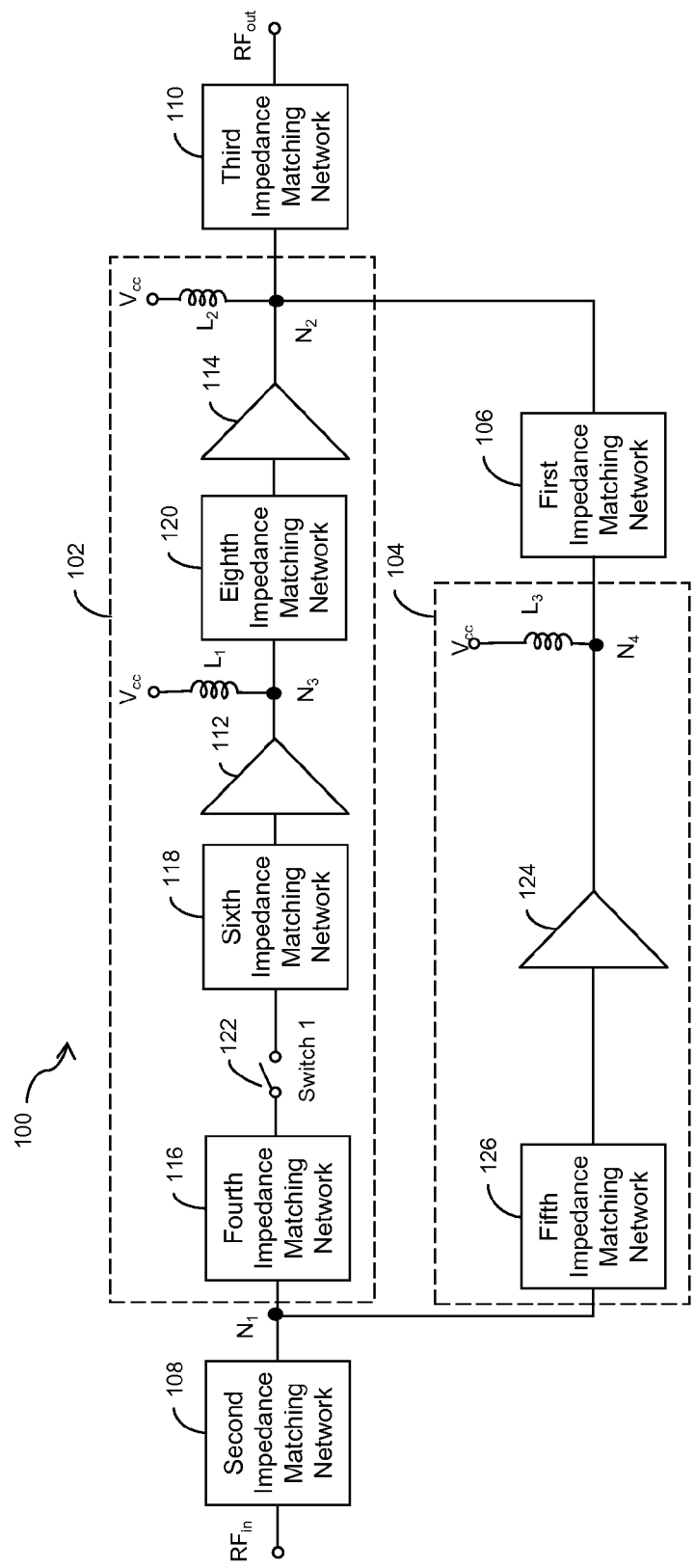
FIG. 4a is an exemplary block diagram illustrating a multi-mode RF power amplifier circuit implemented with only one switch, in accordance with an embodiment of the invention.

FIG. 4a is an exemplary block diagram illustrating multi-mode RF power amplifier circuit 100 implemented with only one switch, in accordance with an embodiment of the invention. Power amplifier circuit 100 (refer to FIG. 4a) includes the elements illustrated to be a part of power amplifier circuit 100 (refer to FIG. 1a) and using the same reference numbers except for the exclusion of second input switch 130 and seventh impedance matching network 128 from low power path 104. Power amplifier circuit 100 (refer to FIG. 4a) has a component connection configuration identical to power amplifier circuit 100 (refer to FIG. 1a) except for the connection of the second terminal of fifth impedance matching circuit 126 and the input terminal of power amplifier 124 connected in low power path 104. The functional operation of components shown to be identical in power amplifier circuit 100 (refer to FIG. 4a) and power amplifier circuit 100 (refer to FIG. 1a) is identical. In low power path 104, the second terminal of fifth impedance matching circuit 126 is connected to the input terminal of power amplifier 124. First input switch 122 is switched on when power amplifier circuit 100 operates in the high power mode and first input switch 122 remains switched off when power amplifier circuit 100 operates in the low power mode.

Figure 4B:
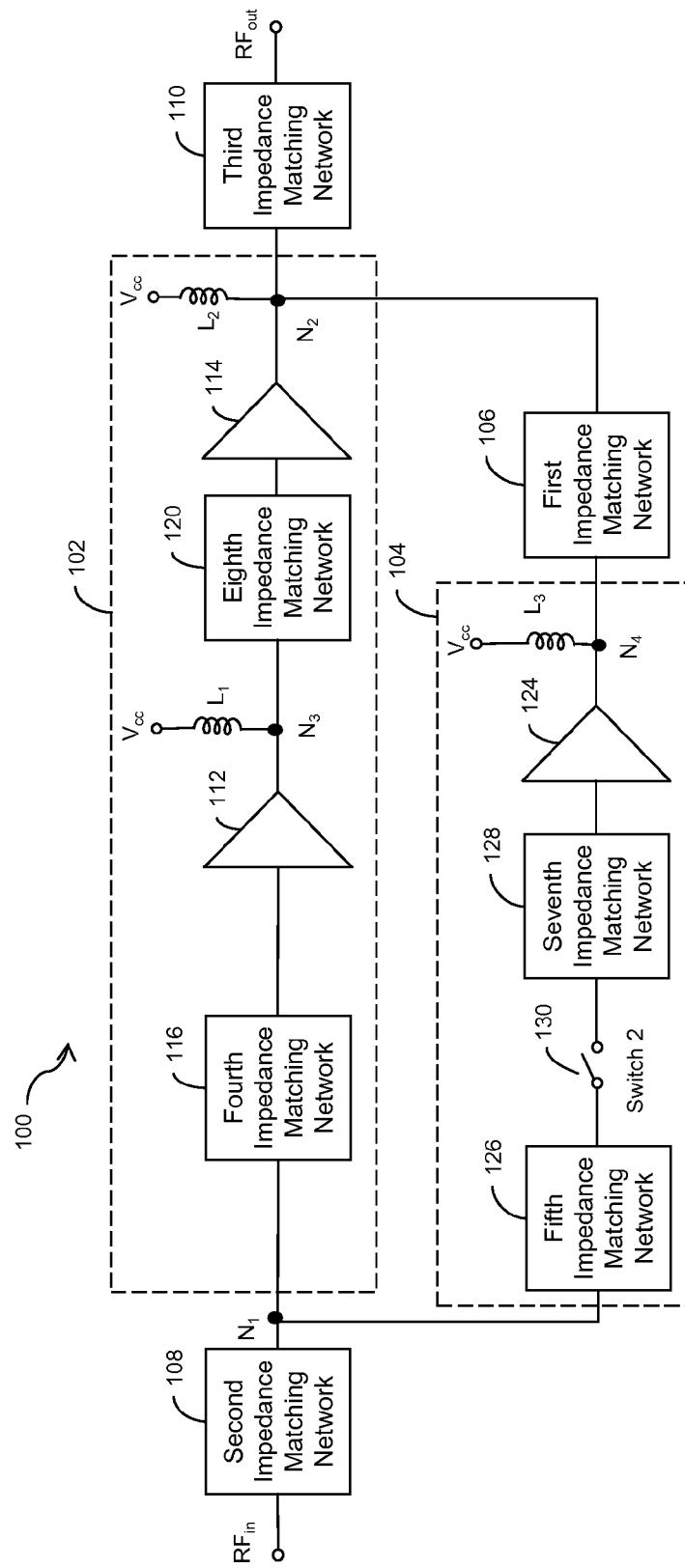
FIG. 4b is an exemplary block diagram illustrating a multi-mode RF power amplifier circuit implemented with only one switch, in accordance with another embodiment of the invention.

FIG. 4b is an exemplary block diagram illustrating multi-mode RF power amplifier circuit 100 implemented with only one switch, in accordance with another embodiment of the invention. Power amplifier circuit 100 (refer to FIG. 4b) includes the elements illustrated to be a part of power amplifier circuit 100 (refer to FIG. 1a) and using the same reference numbers, except for the exclusion of first input switch 122 and sixth impedance matching network 118 from high power path 102. Power amplifier circuit 100 (refer to FIG. 4b) has a component connection configuration identical to power amplifier circuit 100 (refer to FIG. 1a), except for the connections of the second terminal of fourth impedance matching network 116 and the input terminal of power amplifier 112 connected in high power path 102. The functional operation of components shown to be identical in power amplifier circuit 100 (refer to FIG. 4b) and power amplifier circuit 100 (refer to FIG. 1a) is identical. In high power path 102, the second terminal of fourth impedance matching network 116 is connected to the input terminal of power amplifier 112. Second input switch 130 is switched off when power amplifier circuit 100 operates in the high power mode and second input switch 130 remains switched on when power amplifier circuit 100 operates in the low power mode.

Multi-mode RF power amplifier circuitry implemented with only one switch is advantageous due to a reduction in chip size, simplified design and layout, and reduced cost.

Figure 5A:
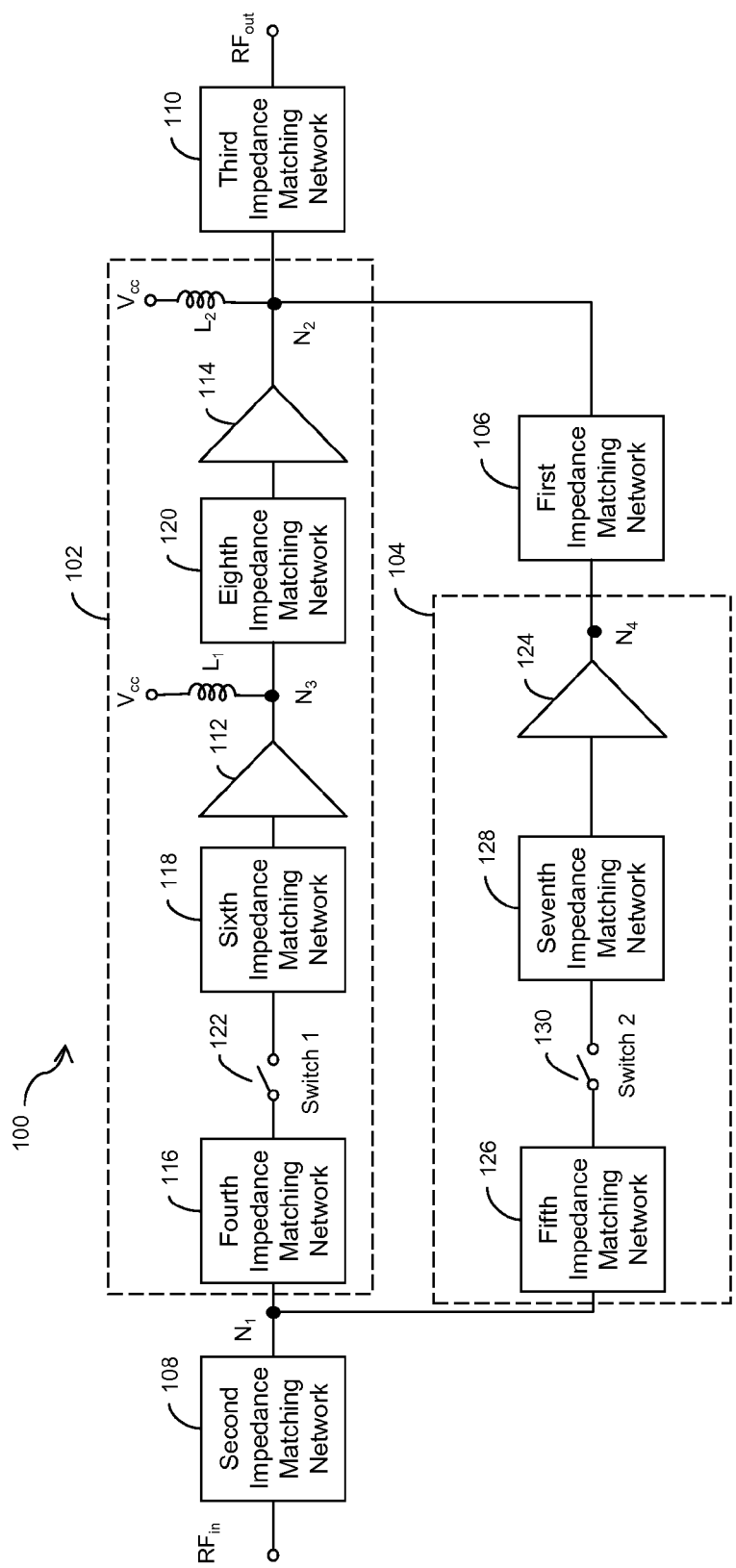
FIG. 5a is an exemplary block diagram illustrating a multi-mode RF power amplifier circuit implemented with a shared bias, in accordance with an embodiment of the invention.

FIG. 5a is an exemplary block diagram illustrating multi-mode RF power amplifier circuit 100 implemented with a shared bias, in accordance with an embodiment of the invention. Power amplifier circuit 100 (refer to FIG. 5a) includes the elements illustrated to be a part of power amplifier circuit 100 (refer to FIG. 1a) and using the same reference numbers, except for the exclusion of the inductor L3 from low power path 104. Power amplifier circuit 100 (refer to FIG. 5a) has a component connection configuration identical to power amplifier circuit 100 (refer to FIG. 1a). The functional operation of components shown to be identical in power amplifier circuit 100 (refer to FIG. 5a) and power amplifier circuit 100 (refer to FIG. 1a) is identical, except for the functional operation of the inductor $L_2$. The inductor $L_2$ connected to the $V_{cc}$ acts as a shared $V_{cc}$ bias for power amplifiers 114 and 124.

Figure 5B:
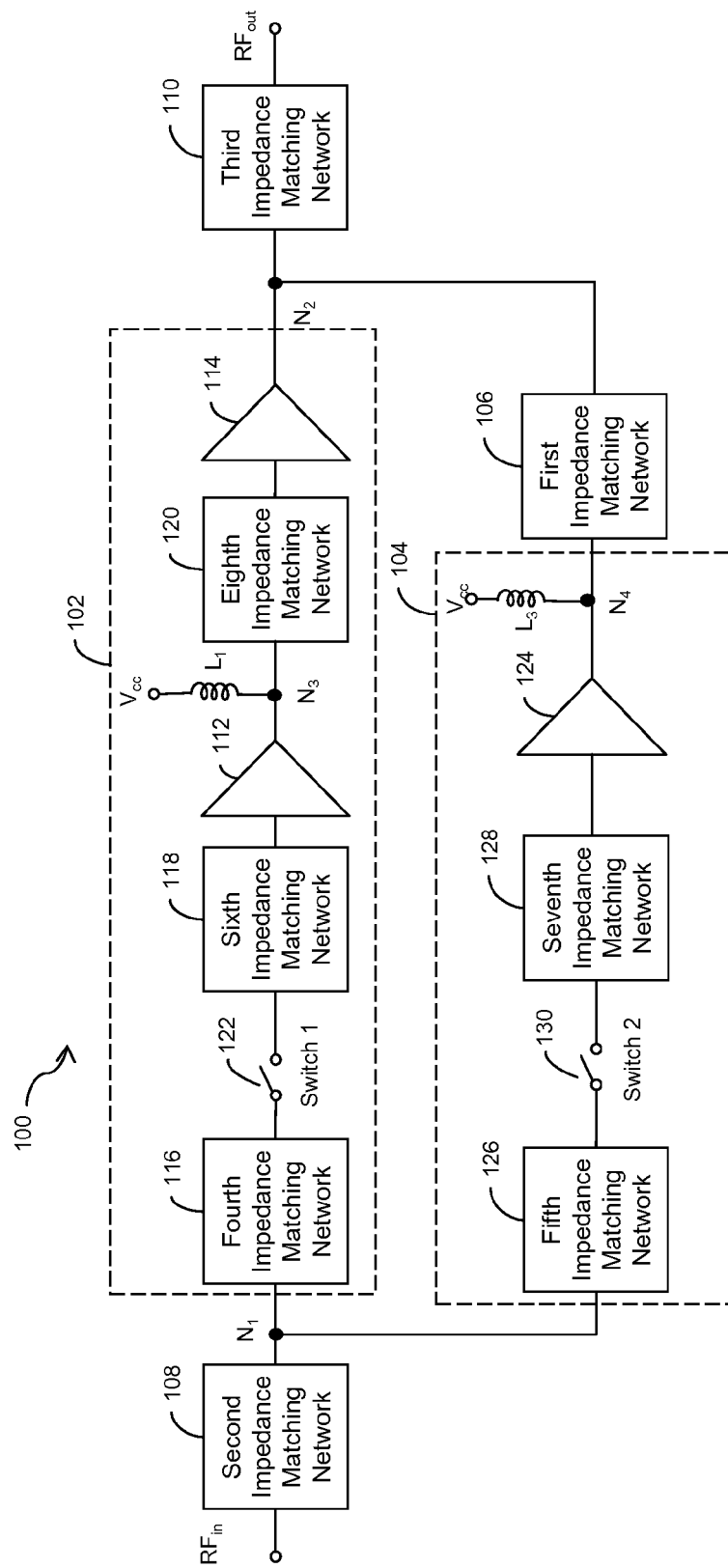
FIG. 5b is an exemplary block diagram illustrating a multi-mode RF power amplifier circuit implemented with a shared bias, in accordance with another embodiment of the invention.

FIG. 5b is an exemplary block diagram illustrating multi-mode RF power amplifier circuit 100 implemented with a shared bias, in accordance with another embodiment of the invention. Power amplifier circuit 100 (refer to FIG. 5b) includes the elements illustrated to be a part of power amplifier circuit 100 (refer to FIG. 1a) and using the same reference numbers, except for the exclusion of the inductor L2 from high power path 102. Power amplifier circuit 100 (refer to FIG. 5b) has a component connection configuration identical to power amplifier circuit 100 (refer to FIG. 1a). The functional operation of components shown to be identical in power amplifier circuit 100 (refer to FIG. 5b) and power amplifier circuit 100 (refer to FIG. 1a) is identical, except for the functional operation of the inductor $L_3$. The inductor $L_3$ connected to the $V_{cc}$ acts as a shared $V_{cc}$ bias for power amplifiers 114 and 124.

By using the shared bias in the RF power amplifier circuit, a large inductor can be eliminated from the amplifier circuit. As a result, the chip size and the cost can be reduced, and routing is simplified.

Figure 6:
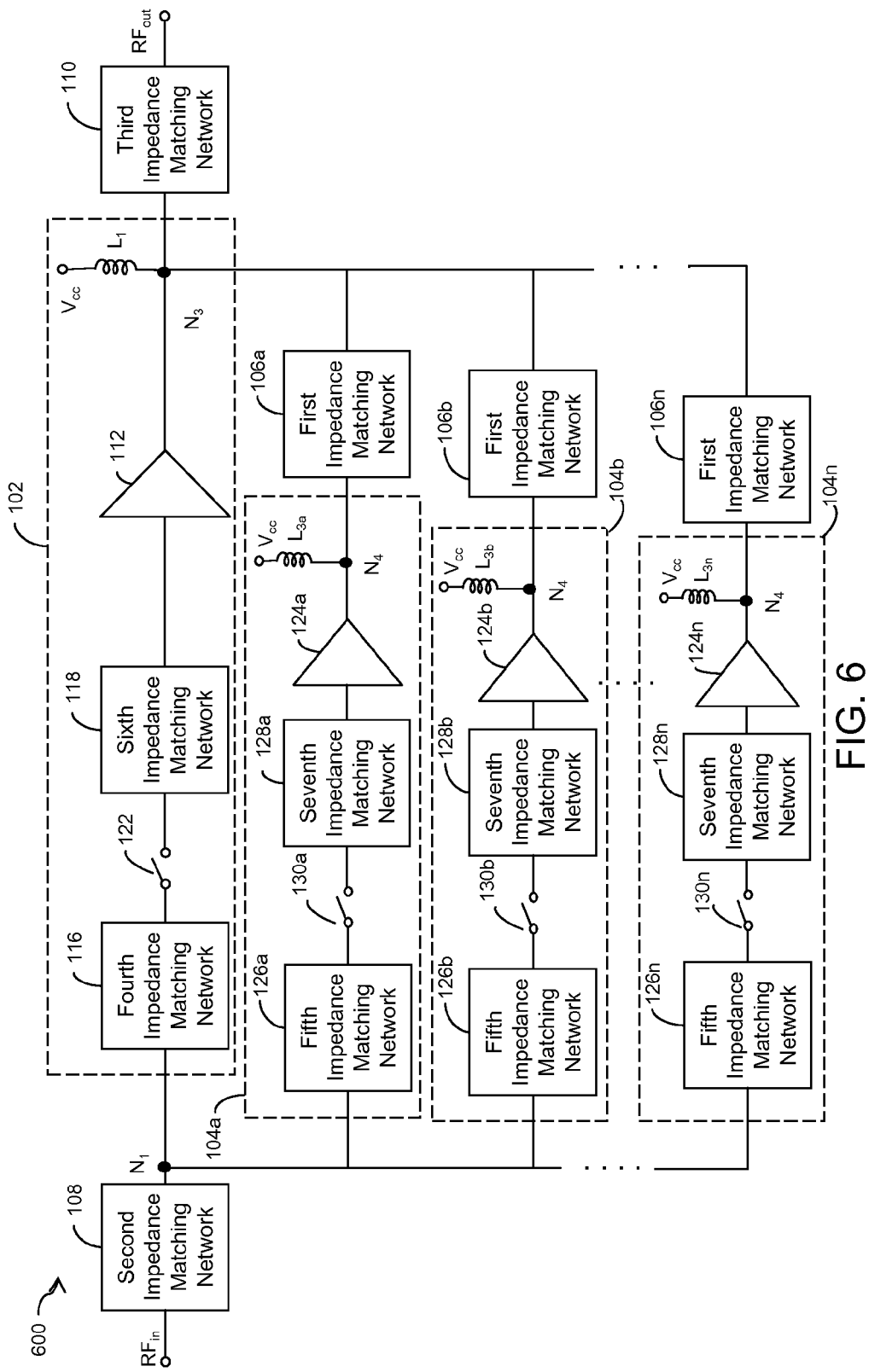
FIG. 6 is an exemplary block diagram illustrating a multi-mode RF power amplifier circuit implemented with multiple low power paths, in accordance with an embodiment of the invention.

FIG. 6 is an exemplary block diagram illustrating a multimode RF power amplifier circuit 600 implemented with multiple low power paths, in accordance with an embodiment of the invention. Power amplifier circuit 600 includes high power path 102 and one or more low power paths 104a, 104b, and 104n. High power path 102 and each low power path 104a, 104b and 104n include the elements illustrated to be a part of power amplifier circuit 100 (refer to FIG. 1a) and using the same reference numbers, except for the exclusion of second power amplifier 114 and the inductor $L_2$ from high power path 102. Further, high power path 102 and each low power path 104a, 104b, and 104n has a component connection configuration identical to power amplifier circuit 100 (refer to FIG. 1a) except for the connection of the output terminal of power amplifier 112 of high power path 102. The functional operation of components shown to be identical in power amplifier circuit 600 (refer to FIG. 6) and power amplifier circuit 100 (refer to FIG. 1a) is also identical.

In an embodiment of the invention, power amplifier circuit 600 operates over more than two power ranges and hence has more than two modes of operation. Each high power path 102 and low power path 104a, 104b, and 104n is designed to operate over a pre-defined power range. Further, an optimum load impedance of each path is different from the other paths, such that the optimum load impedance of high power path 102 is lowest and the optimum load impedance of low power path 102n is highest. When one of the power amplification paths is active, all the other power amplification paths are inactive. This is achieved by biasing the power amplifier corresponding to the active power amplification path and unbiasing the power amplifiers corresponding to the remaining inactive power amplification paths. Simultaneously, the input switch corresponding to the active power amplification path is switched on and the input switches corresponding to the remaining inactive power amplification paths are switched off. For example, under the high power mode operation, power amplifier 112 corresponding to high power path 102 is biased and input switch 122 corresponding to high power path 102 is switched on whereas, power amplifiers 124a, 124b and 124n respectively corresponding to low power paths 104a, 104b, and 104n are unbiased and input switch 130a, 130b, and 130n respectively corresponding to low power paths 104a, 104b, and 104n are switched off. Therefore, high power path 102 becomes active and low power paths 104a, 104b, and 104n become inactive.

In an embodiment of the invention, under the high power mode operation of power amplifier circuit 600, isolation between the input terminals of active high power path 102 and each inactive low power paths 104a, 104b and 104n is achieved when an input impedance of fifth impedance matching networks 126a, 126b, and 126n of inactive low power paths 104a, 104b, and 104n satisfy a fifth pre-determined condition. According to the fifth pre-determined condition, the input impedance of fifth impedance matching network 126a, 126b, and 126n of each of inactive low power paths 104a, 104b, and 104n is comparatively greater than at least five times an input impedance of fourth impedance matching network 116 of high power path 102. In accordance with another embodiment of the present disclosure, the input impedance of fifth impedance matching network 126a, 126b, and 126n of each of inactive low power paths 104a, 104b, and 104n is ten times greater than an input impedance of fourth impedance matching network 116 of active high power path 102. Therefore, the RF signal $RF_{in}$ applied to the input terminal of high power path 102 sees the high impedance presented by inactive low power paths 104a, 104b, and 104n and is coupled to fourth impedance matching network 116.

Under the high power mode operation of power amplifier circuit 600, isolation between the output terminals of active high power path 102 and inactive low power paths 104a, 104b and 104n is achieved when an output impedance of first impedance matching network 106a, 106b and 106c respectively connected between the output terminal of active high power path 102 and the output terminal of each inactive low power path 104a, 104b, and 104c satisfies a first pre-determined condition. According to the first pre-determined condition, the output impedance of first impedance matching network 106a, 106b, and 106c respectively connected between the output terminal of active high power path 102 and the output terminal of each inactive low power path 104a, 104b, and 104c is comparatively greater than at least five times an input impedance of third impedance matching network 110. In accordance with another embodiment of the present disclosure, the output impedance of first impedance matching network 106a, 106b, and 106c respectively connected between the output terminal of active high power path 102 and the output terminal of each inactive low power path 104a, 104b, and 104c is at least ten times greater than an input impedance of third impedance matching network 110.

In an embodiment of the invention under the low power mode operation of power amplifier circuit 600, one of low power amplification paths 104a, 104b, and 104c is active and remaining low power amplification paths 104a, 104b, and 104c are inactive. Simultaneously, high power path 102 is also inactive. For example, under low power mode operation, when low power path 104a is active, the remaining low power paths 104b and 104n, and high power path 102 are inactive. Input switch 130a corresponding to active low power path 104a is switched on. Input switches 130b and 130n corresponding to inactive low power paths 104b and 104n respectively, and input switch 122 corresponding to inactive high power path 102 are switched off. The description below is based on the above example. A person skilled in the art will appreciate, that the description given below can be applied to other examples without deviating from the scope of the invention.

Under the low power mode operation of power amplifier circuit 600, isolation between the input terminals of inactive high power path 102 and active low power path 104a is achieved when an input impedance of fourth impedance matching network 116 of inactive high power path 102 satisfies a fourth pre-determined condition. According to the fourth pre-determined condition, the input impedance of fourth impedance matching network 116 of inactive high power amplification path 102 is comparatively greater than at least five times an input impedance of fifth impedance matching network 126a of active low power path 104a. In accordance with another embodiment of the present disclosure, the input impedance of fourth impedance matching network 116 of inactive high power path 102 is ten times greater than an input impedance of fifth impedance matching network 126a of active low power path 104a. Therefore, the RF signal RF$_{in}$ applied to the input terminal of active low power path 104a, sees the high impedance presented by inactive paths 102, 104b, and 104n and is coupled to fifth impedance matching network 126a of active low power path 104a.

Under the low power mode operation of power amplifier circuit 600, the maximum power level of active low power path 104a is determined by an input impedance of first impedance matching network 106a connected between the output terminal of active low power path 104a and the output terminal of inactive high power path 102. Under the low power mode operation, an input impedance of first impedance matching network 106a satisfies a third pre-determined condition. According to the third pre-determined condition, the input impedance of the first impedance matching network 106a connected between the output terminal of active low power path 104a and the output terminal of inactive high power path 102 is comparatively greater than an input impedance of third impedance matching network 110.

In an embodiment of the invention, under the low power mode operation of power amplifier circuit 600, isolation between the output terminals of inactive high power path 102 and inactive low power paths 104b and 104n is achieved when the output impedance of the first impedance matching networks 106b and 106n respectively connected between the output terminal of inactive high power path 102 and the output terminal of each inactive low power path 104b and 104n satisfies a second predefined condition. The second predefined condition is such that, the output impedance of the first impedance matching networks 106b and 106n, respectively connected between the output terminal of inactive high power path 102 and the output terminal of each inactive low power path 104b and 104n, is comparatively greater than at least five times an input impedance of third impedance matching network 110. In accordance with another embodiment of the present disclosure, the output impedance of the first impedance matching networks 106b and 106n, respectively connected between the output terminal of inactive high power path 102 and the output terminal of the each inactive low power path 104b and 104n, is comparatively greater than at least ten times an input impedance of third impedance matching network 110.

In an embodiment of the invention, under the low power mode operation of power amplifier circuit 600, isolation between the input terminals of active low power path 104a and the remaining inactive low power paths 104b and 104n is achieved when an input impedance of fifth impedance matching network 126b and 126n of each of inactive low power paths 104b and 104n satisfies a sixth pre-defined condition. The sixth pre-defined condition is such that the input impedance of fifth impedance matching network 126b and 126n of each inactive low power path 104b and 104n is comparatively greater than at least five times an input impedance of fifth impedance matching network 126a of active low power path 104a. In accordance with another embodiment of the present disclosure, the input impedance of fifth impedance matching network 126b and 126n of each inactive low power path 104b and 104n is comparatively greater than ten times an input impedance of fifth impedance matching network 126a of active low power path 104a.

Figure 7:
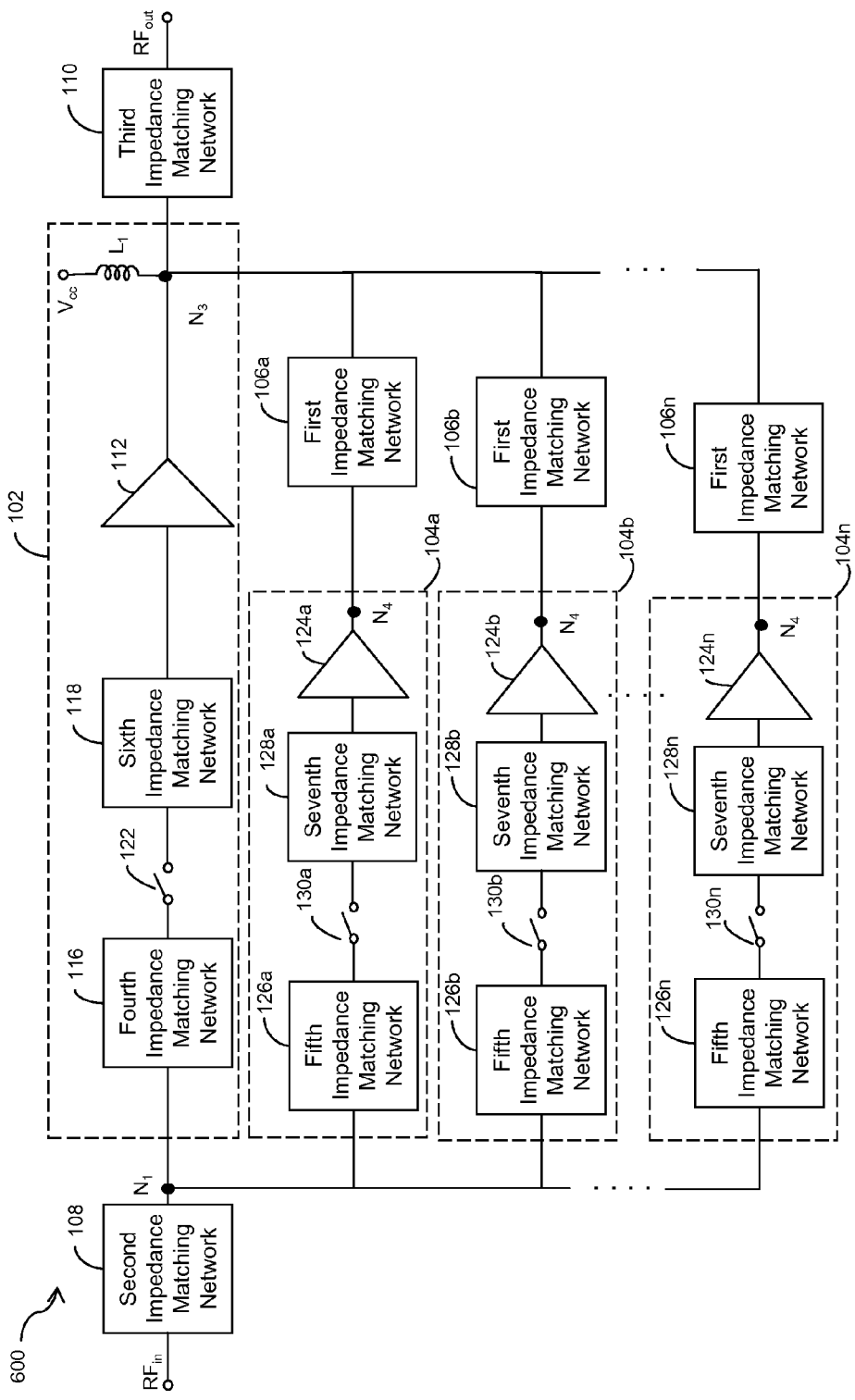
FIG. 7 is an exemplary block diagram illustrating a multi-mode RF power amplifier circuit implemented with a shared bias for multiple low power paths, in accordance with an embodiment of the invention.

FIG. 7 is a block diagram illustrating multi-mode RF power amplifier circuit 600 implemented with a shared bias for one or more low power paths, in accordance with an embodiment of the invention. Power amplifier circuit 600 includes the elements illustrated to be a part of power amplifier circuit 600 (refer to FIG. 6) and using the same reference number, except for the exclusion of the inductor L$_{3a}$, L$_{3b}$ and L$_{3n}$ from each low power paths 104a, 104b and 104n. Power amplifier circuit 600 has a component connection configuration identical to power amplifier circuit 600 (refer to FIG. 6). The functional operation of components shown to be identical in power amplifier circuit 600 (refer to FIG. 7) and power amplifier circuit 600 (refer to FIG. 6) is identical, except for the functional operation of the inductor L$_1$. The inductor L$_1$ connected to the V$_{cc}$ acts as a shared V$_{cc}$ bias for power amplifiers 112, 124a, 124b, and 124n.

By using the shared bias in the RF power amplifier circuit, a large inductor can be eliminated from the amplifier circuit. As a result, the chip size and the cost can be reduced, and routing is simplified.

Various embodiments of the invention provide several advantages. Negligible output power will be leaked into the inactive paths and its matching networks. This results in reduced current consumption and improved power added efficiency under the output power-back off operation.

Another advantage of the invention is the elimination of switches at an output of the active and inactive paths. Consequently, the power amplifier circuit of the invention will be able to operate under low bias voltage.

The power amplifier is capable of operating under dynamic bias supply, wherein the bias voltage is adjusted dynamically according to the output power of the RF power amplifier in order to further reduce current consumption under the power back-off operation.

While various embodiments of the invention have been illustrated and described, it will be clear that the invention is not limited to these embodiments only. Numerous modifications, changes, variations, substitutions and equivalents will be apparent to those skilled in the art, without departing from the basic scope and spirit of the invention, as described in the claims that follow.

What is claimed is:

1. A power amplifier circuit for amplifying a radio frequency (RF) signal, the power amplifier circuit operating in at least one of a first power amplification mode and a second power amplification mode, the power amplifier circuit comprising:

a first power amplification path having an input terminal and an output terminal, wherein the first power amplification path is active when the power amplifier circuit operates in the first power amplification mode;

one or more second power amplification paths having an input terminal and an output terminal, wherein one of the one or more second power amplification paths is active and remaining of the one or more second power amplification paths are inactive when the power amplifier circuit operates in the second power amplification mode, the input terminal of each of the one or more second power amplification paths is coupled to the input terminal of the first power amplification path; and a first impedance matching network respectively connected between the output terminal of each of the one or more second power amplification paths and the output terminal of the first power amplification path, wherein:

the output impedance of the first impedance matching network connected between the output terminal of the each inactive second power amplification path and the output terminal of the first power amplification path satisfies a first pre-determined condition when the power amplifier circuit operates in the first power amplification mode and a second pre-determined condition when the power amplifier circuit operates in the second power amplification mode; and an input impedance of the first impedance matching network connected between the output terminal of the active second power amplification path and the output terminal of the first power amplification path satisfies a third pre-determined condition when the power amplifier circuit operates in the second power amplification mode.

2. The power amplifier circuit of claim 1 further comprising:
a second impedance matching network having an input terminal and an output terminal, wherein the input terminal of the second impedance matching network receives the radio frequency (RF) signal and the output terminal of the second impedance matching network is coupled to the input terminal of the first power amplification path; and
a third impedance matching network having an input terminal and an output terminal, wherein the input terminal of the third impedance matching network is coupled to the output terminal of the first power amplification path and the output terminal of the third impedance matching network provides an output radio frequency (RF) signal.

3. The power amplifier circuit of claim 2, wherein the first pre-determined condition being the output impedance of the first impedance matching network respectively connected between the output terminal of the each inactive second power amplification path and the output terminal of the first power amplification path is comparatively greater than at least five times an input impedance of the third impedance matching network when the power amplifier circuit operates in the first power amplification mode.

4. The power amplifier circuit of claim 2, wherein the second pre-determined condition being the output impedance of the first impedance matching network respectively connected between the output terminal of the each inactive second power amplification path and the output terminal of the first power amplification path comparatively greater than at least five times an input impedance of the third impedance matching network when the power amplifier circuit operates in the second power amplification mode.

5. The power amplifier circuit of claim 2, wherein the third pre-determined condition being that the input impedance of the first impedance matching network connected between the output terminal of the active second power amplification path and the output terminal of the first power amplification path is comparatively greater than an input impedance of the third impedance matching network when the power amplifier circuit operates in the second power amplification mode.

6. The power amplifier circuit of claim 2, wherein the first power amplification path comprises:
at least one power amplifier configured for amplifying the radio frequency signal when the power amplifier circuit operates in the first power amplification mode; and
a fourth impedance matching network, wherein an input impedance of the fourth impedance matching network satisfies a fourth pre-determined condition when the power amplifier circuit operates in the second power amplification mode.

7. The power amplifier circuit of claim 6, wherein the first power amplification path further comprising:
a first input switch, wherein the first input switch is turned on when the power amplifier circuit operates in the first power amplification mode.

8. The power amplifier circuit of claim 6, wherein the one or more second power amplification paths comprising:
at least one power amplifier configured for amplifying the radio frequency signal when the power amplifier circuit operates in the second power amplification mode; and
a fifth impedance matching network, wherein an input impedance of the fifth impedance matching network of the each inactive second power amplification path satisfies a fifth pre-determined condition when the power amplifier circuit operates in the first power amplification mode and satisfies a sixth pre-determined condition when the power amplifier circuit operates in the second power amplification mode.

9. The power amplifier circuit of claim 8, wherein the one or more second power amplification paths further comprising:
a second input switch, wherein the second input switch is turned on when the power amplifier circuit operates in the second power amplification mode.

10. The power amplifier circuit of claim 8, wherein the fourth pre-determined condition is that the input impedance of the fourth impedance matching network is comparatively greater than five times an input impedance of the fifth impedance matching network of the active second power amplification path when the power amplifier circuit operates in the second power amplification mode.

11. The power amplifier circuit of claim 8, wherein the fifth pre-determined condition is that the input impedance of the fifth impedance matching network of the each inactive second power amplification path is comparatively greater than at least five times an input impedance of the fourth impedance matching network when the power amplifier circuit operates in the first power amplification mode.

12. The power amplifier circuit of claim 8, wherein the sixth pre-determined condition is that the input impedance of the fifth impedance matching network of the each inactive second power amplification paths is comparatively greater than at least ten times an input impedance of the fifth impedance matching network of the active second power amplification path when the power amplifier circuit operates in the second power amplification mode.

13. The power amplifier circuit of claim 1, wherein the power amplifier circuit further comprises:
control logic configured to operate the power amplifier circuit in at least one of the first power amplification mode and the second power amplification mode.

14. A radio frequency power amplifier circuit amplifying a radio frequency (RF) signal, the power amplifier circuit operating in at least one of a high power mode and a low power mode, the power amplifier circuit comprising:
a high power path comprising a fourth impedance matching network, wherein the high power path is active when the power amplifier circuit operates in the high power mode;
one or more low power paths, wherein one of the one or more low power paths is active and the remaining one or more low power paths are inactive when the power amplifier circuit operates in the low power mode, the one or more low power paths comprising a fifth impedance matching network, wherein an input impedance of the fifth impedance matching network of the each inactive low power path is comparatively greater than an input impedance of the fourth impedance matching network when the power amplifier circuit operates in the high power mode;
a first impedance matching network respectively connected between each of the inactive low power path and the high power path;

a second impedance matching network receiving the radio frequency (RF) signal; and a third impedance matching network providing an output radio frequency (RF) signal;

wherein an output impedance of the first impedance matching network respectively connected between each of the inactive low power path and the high power path is comparatively greater than an input impedance of the third impedance matching network when the power amplifier circuit operates in the high power mode; and an input impedance of the first impedance matching network connected between the active low power path and the high power path is comparatively greater than an input impedance of the third impedance matching network when the power amplifier circuit operates in the low power mode.

15. The power amplifier circuit of claim 14, wherein the output impedance of the first impedance matching network respectively connected between each of the one or more inactive low power paths and the high power path is comparatively greater than at least five times the input impedance of the third impedance matching network when the power amplifier circuit operates in the high power mode.

16. The power amplifier circuit of claim 14, wherein the output impedance of first impedance matching network connected between each inactive low power path and the high power path is comparatively greater than an input impedance of the third impedance matching network when the power amplifier circuit operates in the low power mode.

17. The power amplifier circuit of claim 14, wherein the input impedance of the fourth impedance matching network is comparatively greater than at least five times the input impedance of the fifth impedance matching network of the active second power amplification path when the power amplifier circuit operates in the low power mode.

18. The power amplifier circuit of claim 14, wherein the input impedance of the fifth impedance matching network of the each inactive low power paths is comparatively greater than at least five times the input impedance of the fourth impedance matching network when the power amplifier circuit operates in the high power mode.

19. The power amplifier circuit of claim 14, wherein the input impedance of the fifth impedance matching network of the each inactive low power paths is comparatively greater than at least five times an input impedance of the fifth impedance matching network of the active low power amplification path when the power amplifier circuit operates in the low power mode.

20. The power amplifier circuit of claim 14, wherein the high power path comprises:

at least one power amplifier configured for amplifying the radio frequency signal when the power amplifier circuit operates in the high power mode; and a first input switch, wherein the first input switch is turned on when the power amplifier circuit operates in the high power mode.

21. The power amplifier circuit of claim 14, wherein the one or more low power paths further comprises:

at least one power amplifier configured for amplifying the radio frequency signal when the power amplifier circuit operates in the low power mode; and a second input switch, wherein the second input switch is turned on when the power amplifier circuit operates in the low power mode.

22. The power amplifier circuit of claim 14, wherein the power amplifier circuit further comprising:

Control logic configured to operate the power amplifier circuit in at least one of the low power amplification mode and the high power amplification mode.

* * * * *